(12) United States Patent
Latypov et al.

(10) Patent No.: US 6,965,436 B2
(45) Date of Patent: *Nov. 15, 2005

(54) SYSTEM AND METHOD FOR CALIBRATING A SPATIAL LIGHT MODULATOR ARRAY USING SHEARING INTERFEROMETRY

(75) Inventors: Azat M. Latypov, Danbury, CT (US); Sherman K. Poultney, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/981,706

(22) Filed: Nov. 5, 2004

(65) Prior Publication Data

US 2005/0168791 A1  Aug. 4, 2005

Related U.S. Application Data

(63) Continuation of application No. 10/765,947, filed on Jan. 29, 2004, now Pat. No. 6,847,461.

(51) Int. Cl.⁷ .............................. G01B 9/02; G01J 1/20
(52) U.S. Cl. .................................. 356/520; 250/201.9
(58) Field of Search ............................... 356/121, 520, 356/521; 250/201.9

(56) References Cited

U.S. PATENT DOCUMENTS

| | | | |
|---|---|---|---|
| 5,042,950 A | 8/1991 | Salmon, Jr. ............... | 356/520 |
| 5,229,872 A | 7/1993 | Mumola ..................... | 349/2 |
| 5,296,891 A | 3/1994 | Vogt et al. ................. | 355/67 |
| 5,500,736 A | 3/1996 | Koitabashi et al. ......... | 356/620 |
| 5,523,193 A | 6/1996 | Nelson ..................... | 430/311 |
| 5,530,482 A | 6/1996 | Gove et al. ................. | 348/441 |
| 5,579,147 A | 11/1996 | Mori et al. ................. | 359/204 |
| 5,677,703 A | 10/1997 | Bhuva et al. ............... | 345/84 |
| 5,808,797 A | 9/1998 | Bloom et al. ............... | 359/572 |
| 5,982,553 A | 11/1999 | Bloom et al. ............... | 359/627 |
| 6,057,913 A | 5/2000 | Brown et al. ............... | 356/121 |
| 6,133,986 A | 10/2000 | Johnson ..................... | 355/67 |
| 6,177,980 B1 | 1/2001 | Johnson ..................... | 355/67 |
| 6,674,519 B2 | 1/2004 | Mui ........................ | 356/121 |
| 6,687,041 B1 | 2/2004 | Sandstrom ................. | 359/291 |
| 6,747,783 B1 | 6/2004 | Sandstrom ................. | 359/290 |
| 6,795,169 B2 | 9/2004 | Tanaka et al. .............. | 355/67 |
| 6,806,897 B2 | 10/2004 | Kataoka et al. ............. | 347/256 |

(Continued)

FOREIGN PATENT DOCUMENTS

WO    WO 98/33096    7/1998

(Continued)

Primary Examiner—Georgia Epps
Assistant Examiner—William Choi
(74) Attorney, Agent, or Firm—Sterne, Kessler, Goldstein & Fox PLLC

(57) ABSTRACT

A system for calibrating a spatial light modulator array includes an illumination system and a spatial light modulator array that reflects or transmits light from the illumination system. A projection optical system images the spatial light modulator array onto an image plane. A shearing interferometer creates an interference pattern in the image plane. A controller controls modulation of elements of the spatial light modulator array. The shearing interferometer includes a diffraction grating, a prism, a folding mirror or any other arrangement for generating shear. The shearing interferometer can be a stretching shearing interferometer, a lateral shearing interferometer, or a rotational shearing interferometer. The shearing interferometer may include a diffraction grating with a pitch corresponding to a shear of the light by an integer number of elements. The projection optics resolves each element of the spatial light modulator array in the image plane. The controller can modulate alternate columns of elements of the spatial light modulator array.

22 Claims, 17 Drawing Sheets

U.S. PATENT DOCUMENTS

| | | |
|---|---|---|
| 6,811,953 B2 | 11/2004 | Hatada et al. .............. 430/311 |
| 6,847,461 B1 * | 1/2005 | Latypov et al. ............. 356/520 |
| 2003/0137655 A1 | 7/2003 | Wegmann ................... 356/124 |
| 2004/0041104 A1 | 3/2004 | Liebregts et al. ...... 250/492.22 |
| 2004/0130561 A1 | 7/2004 | Jain .......................... 345/694 |
| 2005/0007572 A1 | 1/2005 | George et al. ................ 355/55 |

FOREIGN PATENT DOCUMENTS

| WO | WO 98/38597 | 9/1998 |
|---|---|---|

* cited by examiner

Resolved pixel image

SYSTEM AND METHOD FOR CALIBRATING A SPATIAL LIGHT MODULATOR ARRAY USING SHEARING INTERFEROMETRY

CROSS-REFERENCE TO RELATED APPLICATIONS

This application is a continuation of U.S. patent application Ser. No. 10/765,947, filed on Jan. 29, 2004, now U.S. Pat. No. 6,847,461, entitled SYSTEM AND METHOD FOR CALIBRATING A SPATIAL LIGHT MODULATOR ARRAY USING SHEARING INTERFEROMETRY, which is incorporated herein by reference.

BACKGROUND OF THE INVENTION

1. Field of the Invention

The present invention relates generally to lithography. More particularly, the present invention relates to wavefront aberration measurement for purposes of SLM calibration in maskless lithography.

2. Related Art

Lithography is a process used to create features on the surface of substrates. Such substrates can include those used in the manufacture of flat panel displays (e.g., liquid crystal displays), circuit boards, various integrated circuits, and the like. A frequently used substrate for such applications is a semiconductor wafer or glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image projected onto the surface of the wafer by exposure optics located within a lithography apparatus. While exposure optics are used in the case of photolithography, a different type of exposure apparatus can be used depending on the particular application. For example, x-ray, ion, electron, or photon lithography each can require a different exposure apparatus, as is known to those skilled in the art. The particular example of photolithography is discussed here for illustrative purposes only.

The projected image produces changes in the characteristics of a layer, for example photoresist, deposited on the surface of the wafer. These changes correspond to the features projected onto the wafer during exposure. Subsequent to exposure, the layer can be etched to produce a patterned layer. The pattern corresponds to those features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time, individual fields are scanned onto the wafer one at a time. This is accomplished by moving the wafer and reticle simultaneously such that the imaging slot is moved across the field during the scan. The wafer stage must then be asynchronously stepped between field exposures to allow multiple copies of the reticle pattern to be exposed over the wafer surface. In this manner, the quality of the image projected onto the wafer is maximized.

Conventional lithographic systems and methods form images on a semiconductor wafer. The system typically has a lithographic chamber that is designed to contain an apparatus that performs the process of image formation on the semiconductor wafer. The chamber can be designed to have different gas mixtures and grades of vacuum depending on the wavelength of light being used. A reticle is positioned inside the chamber. A beam of light is passed from an illumination source (located outside the system) through an optical system, an image outline on the reticle, and a second optical system before interacting with a semiconductor wafer.

A plurality of reticles are required to fabricate a device on the substrate. These reticles are becoming increasingly costly and time consuming to manufacture due to the feature sizes and the exacting tolerances required for small feature sizes. Also, a reticle can only be used for a certain period of time before being worn out. Further costs are routinely incurred if a reticle is not within a certain tolerance or when the reticle is damaged. Thus, the manufacture of wafers using reticles is becoming increasingly, and possibly prohibitively expensive.

In order to overcome these drawbacks, maskless (e.g., direct write, digital, etc.) lithography systems have been developed. The maskless system replaces a reticle with a spatial light modulator (SLM) (e.g., a digital pixel device (DMD), a liquid crystal display (LCD), a grating light valve (GLV) or the like). The SLM includes an array of active areas (e.g., tilting and/or pistoning mirrors or greytoning LCD array cells) that vary optical properties in a controlled fashion to form a desired pattern.

Conventional SLM-based writing systems (e.g., Micronic's Sigma 7000 series tools) use one SLM as the pattern generator. To achieve linewidth and line placement specifications, gray scaling is used. For analog SLMs, gray scaling is achieved by controlling mirror tilt angle (e.g., Micronic SLM) or polarization angle (e.g., LCD). For digital SLMs (e.g., TI DMD), gray scaling is achieved by numerous passes or pulses, where for each pass or pulse the pixel (micromirror) can be switched either ON or OFF (for a binary SLM, or some in-between state for other SLMs) depending on the level of gray desired. Because of the total area on the substrate to be printed, the spacing between active areas, the timing of light pulses, and the movement of the substrate, several passes of the substrate are required to expose all desired areas. This results in low throughput (number of pixels packed into an individual optical field/number of repeat passes required over the substrate) and increased time to fabricate devices. Furthermore, using only one SLM requires more pulses of light or more exposure time to increase gray scale. This can lead to unacceptably low levels of throughput.

Therefore, what is needed is a maskless lithography system and method that can expose all desired areas on a substrate for each pattern during only one pass of a substrate.

SUMMARY OF THE INVENTION

The present invention is directed to a system and method for calibrating a spatial light modulator array using shearing interferometry that substantially obviates one or more of the problems and disadvantages of the related art.

The present invention includes a system for calibrating a spatial light modulator array with an illumination system and a spatial light modulator array that reflects or transmits light from the illumination system. A projection optical system images the spatial light modulator array onto an image plane. A shearing interferometer creates an interference pattern in the image plane. A controller controls tilting, pistoning, and/or deformation of elements of the spatial light modulator array. The shearing interferometer includes an arrangement for generating shear, e.g., a diffraction grating, prisms, folding mirrors, etc. The shearing interferometer can be, for example, a stretching shearing interferometer, a lateral shearing interferometer, a radial shearing interferometer, or a rotational shearing interferometer. The shearing interferometer may, but not necessarily, include a diffraction grating with a pitch corresponding to a shear of the light by an integer number of elements. The projection optics resolves each element of the spatial light modulator array in the image plane. The controller, in one embodiment, modulates alternate columns of elements of the spatial light modulator array.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and together with the description serve to explain the principles of the invention. In the drawings.

DETAILED DESCRIPTION OF EMBODIMENTS OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
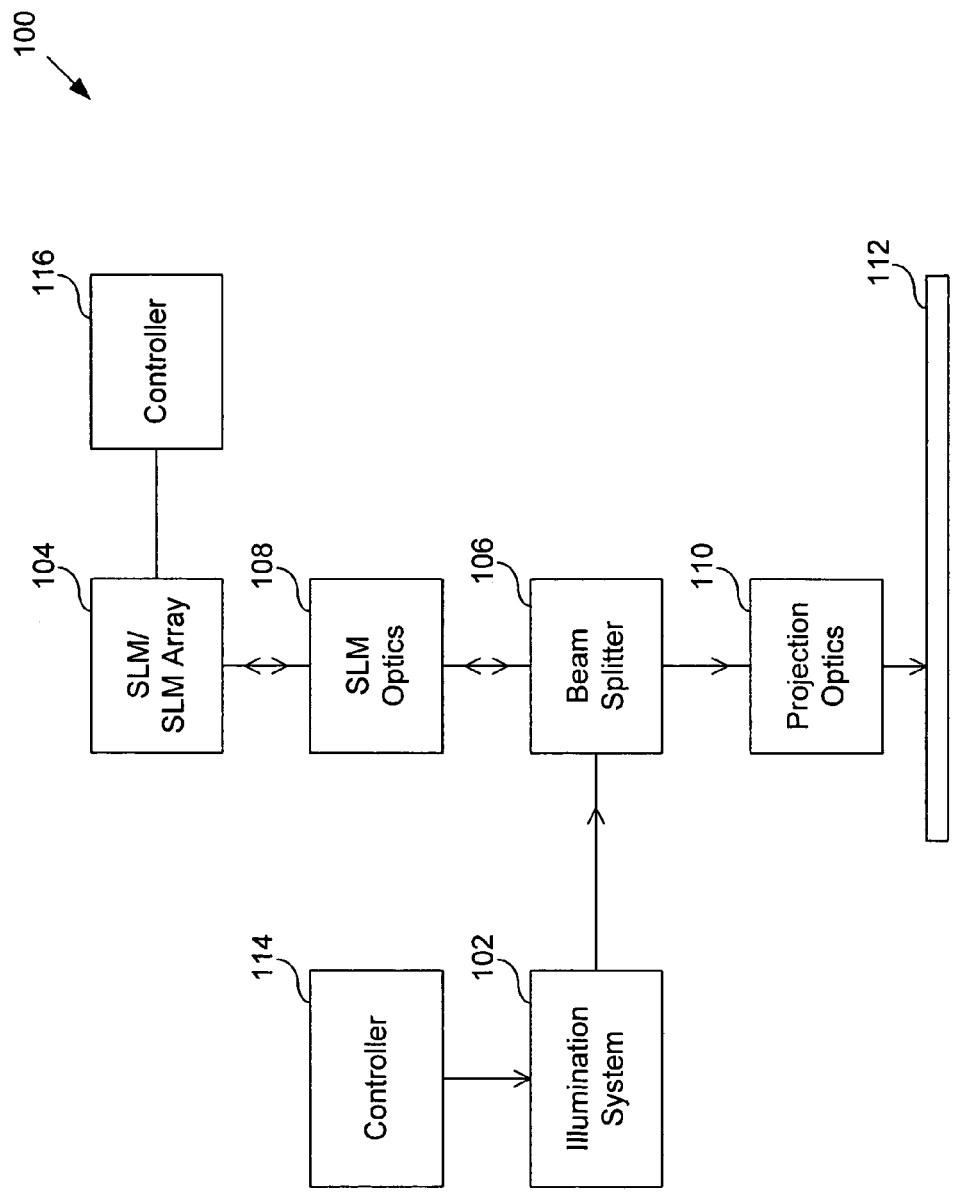
FIG. 1 shows a maskless lithography system having reflective spatial light modulators.

FIG. 1 shows a maskless lithography system 100 according to an embodiment of the present invention. System 100 includes an illumination system 102 that transmits light to a reflective spatial light modulator (SLM) 104 (e.g., a digital micromirror device (DMD), a reflective liquid crystal display (LCD), or the like) via a beam splitter 106 and SLM optics 108. SLM 104 is used to pattern the light in place of a reticle in traditional lithography systems. Patterned light reflected from SLM 104 is passed through beam splitter 106 and projection optics (PO) 110 and written on an object 112 (e.g., a substrate, a semiconductor wafer, a glass substrate for a flat panel display, or the like).

It is to be appreciated that illumination optics can be housed within illumination system 102, as is known in the relevant art. It is also to be appreciated that SLM optics 108 and projection optics 110 can include any combination of optical elements required to direct light onto desired areas of SLM 104 and/or object 112, as is known in the relevant art.

In alternative embodiments, either one or both of illumination system 102 and SLM 104 can be coupled to or have integral controllers 114 and 116, respectively. Controller 114 can be used to adjust illumination source 102 based on feedback from system 100 or to perform calibration. Controller 116 can also be used for adjustment and/or calibration. Alternatively, controller 116 can be used for controlling active devices (e.g., pixels, mirrors, locations, etc.) 302 (see FIG. 3, discussed below) on SLM 104, to generate a pattern used to expose object 112. Controller 116 can either have integral storage or be coupled to a storage element (not shown) with predetermined information and/or algorithms used to generate the pattern or patterns.

Figure 2:
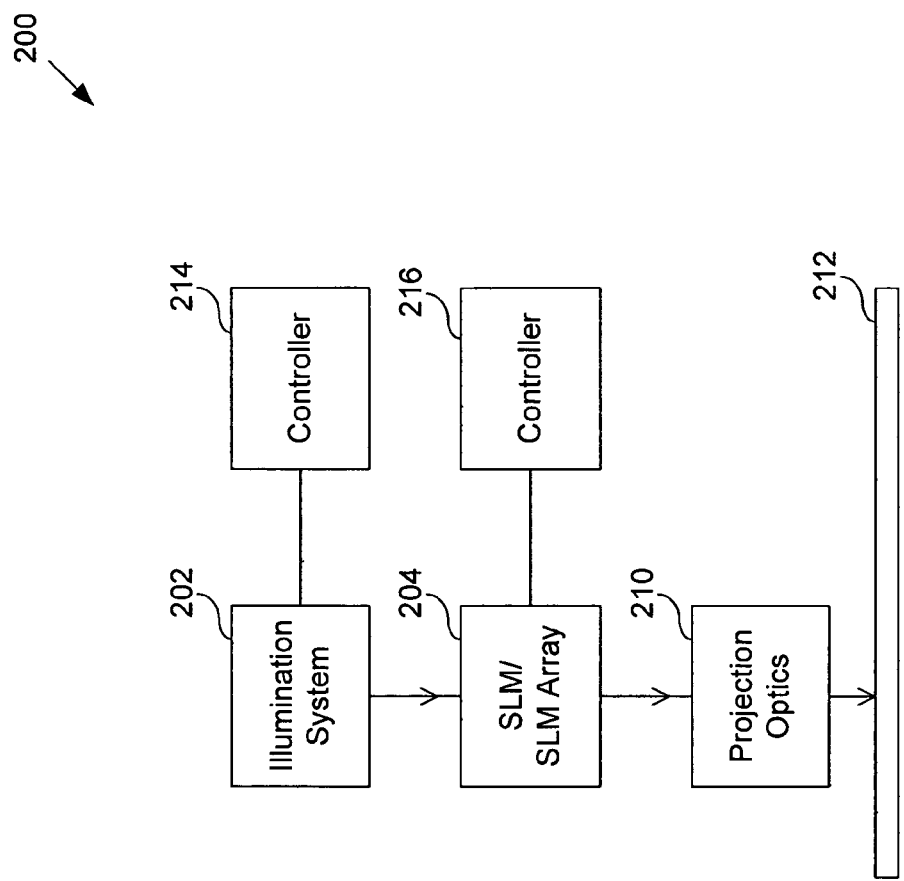
FIG. 2 shows a maskless lithography system having transmissive spatial light modulators.

FIG. 2 shows a maskless lithography system 200 according to a further embodiment of the present invention. System 200 includes an illumination source 202 that transmits light through a SLM 204 (e.g., a transmissive LCD, or the like) to pattern the light. The patterned light is transmitted through projection optics 210 to write the pattern on a surface of an object 212. In this embodiment, SLM 204 is a transmissive SLM, such as a liquid crystal display, or the like. Similar to above, either one or both of illumination source 202 and SLM 204 can be coupled to or integral with controllers 214 and 216, respectively. Controllers 214 and 216 can perform similar functions as controller 114 and 116 described above, and as known in the art.

Example SLMs that can be used in systems 100 or 200 are manufactured by Micronic Laser Systems AB of Sweden and Fraunhofer Institute for Circuits and Systems of Germany. A grating light valve (GLV) SLM is another example of an SLM where the present invention is applicable.

Merely for convenience, reference will be made only to system 100 below. However, all concepts discussed below can also apply to system 200, as would be known to someone skilled in the relevant arts.

Figure 3:
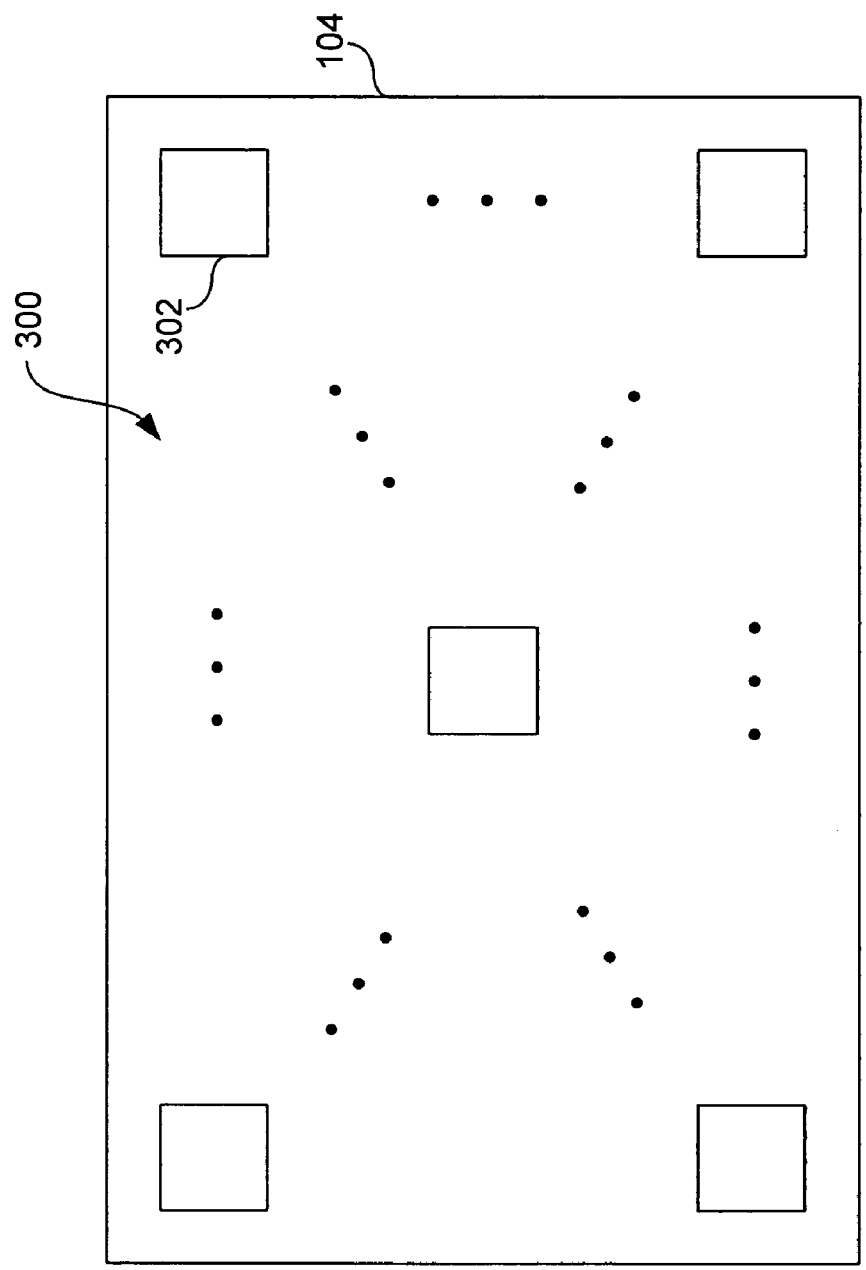
FIG. 3 shows another illustration of a spatial light modulator according to an embodiment of the present invention.

FIG. 3 shows details of an active area 300 of SLM 104. Active area 300 includes an array of active devices 302 (represented by dotted patterns in the figure). Active devices 302 can be mirrors on a DMD or locations on a LCD. It is to be appreciated that active devices 302 can also be referred to as pixels, as is known in the relevant art. By adjusting the physical characteristics of active devices 302, they can be seen as being either ON or OFF (for a binary SLM) or a state in-between ON and OFF for other SLMs. Digital or analog input signals based on a desired pattern are used to control various active devices 302. In some embodiments, an actual pattern being written to object 112 can be detected and a determination can be made whether the pattern is outside an acceptable tolerance. If so, controller 116 can be used to generate analog or digital control signals in real time to fine-tune (e.g., calibrate, adjust, etc.) the pattern being generated by SLM 104.

Figure 4:
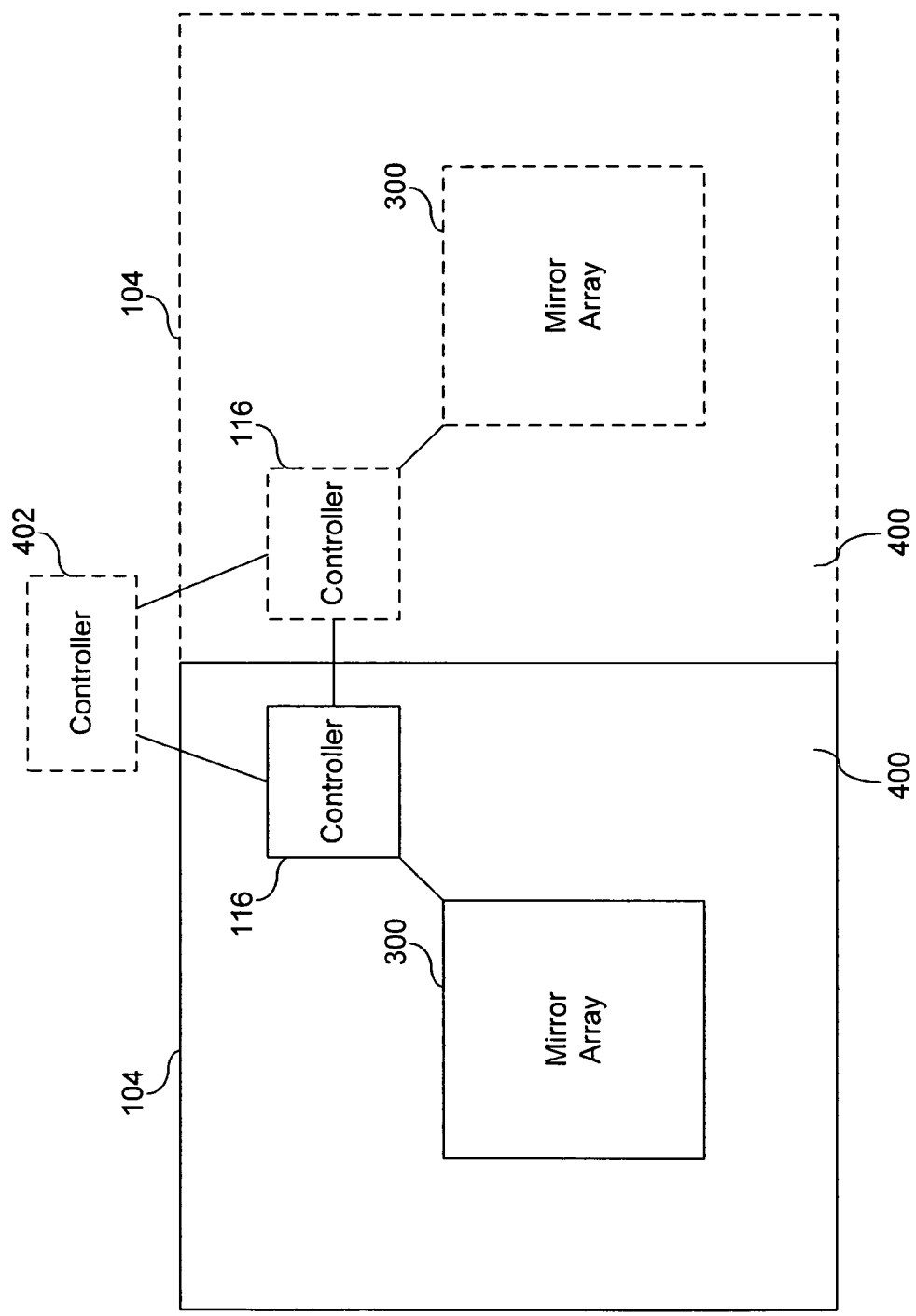
FIG. 4 shows more details of the spatial light modulator of FIG. 3.

FIG. 4 shows further details of SLM 104. SLM 104 can include an inactive packaging 400 surrounding active area 300. Also, in alternative embodiments, a main controller 402 can be coupled to each SLM controller 116 to monitor and control an array of SLMs, as discussed below. Also discussed below, adjacent SLMs may be offset or staggered with respect to each other in other embodiments.

Figure 5:
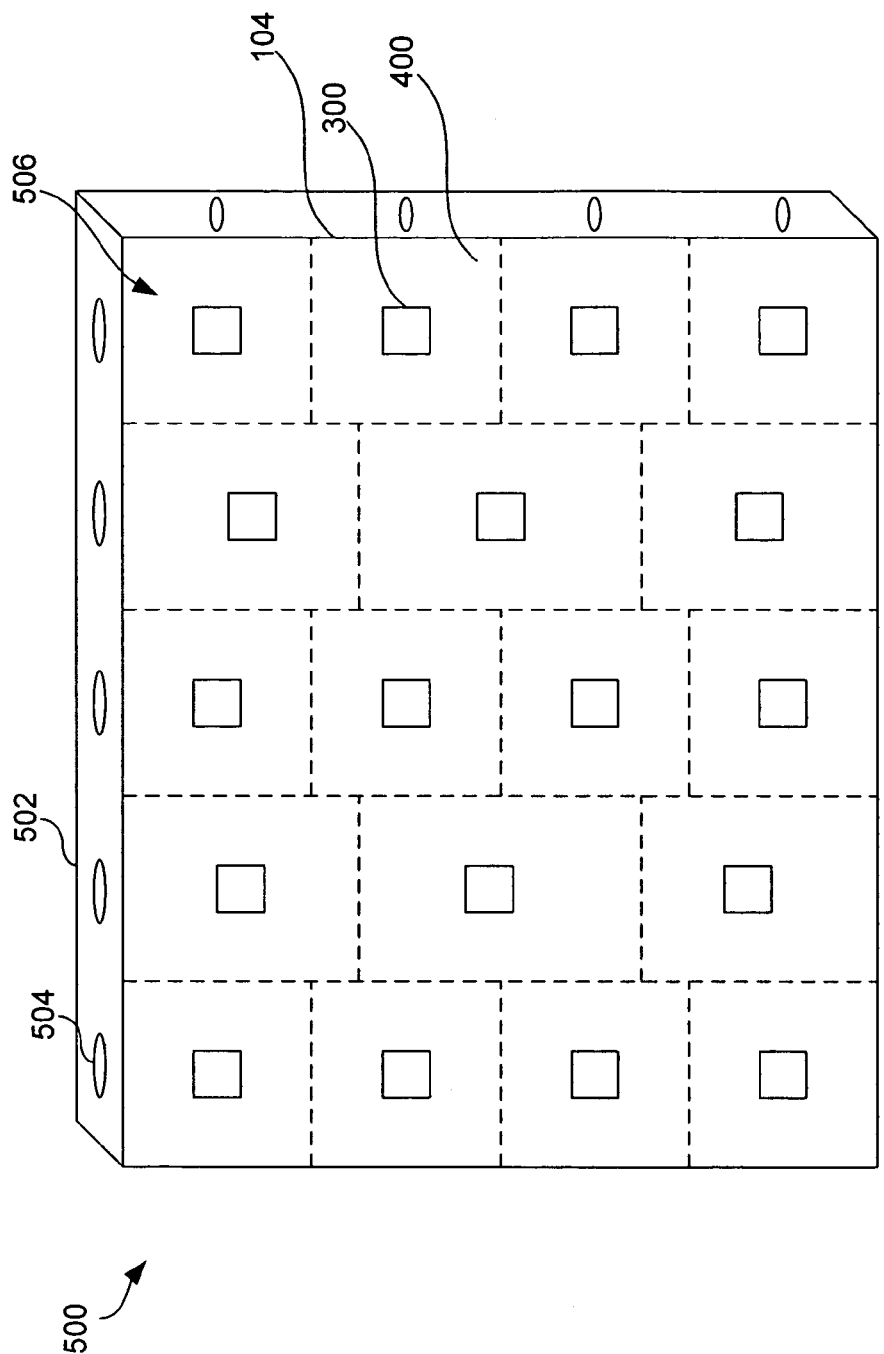
FIG. 5 shows a two-dimensional array of the spatial light modulator according to one embodiment of the present invention.

FIG. 5 shows an assembly 500 including a support device 502 that receives an array of SLMs 104. In various embodiments, as described in more detail below, the array of SLMs 104 can have varying numbers of columns, rows, SLMs per column, SLMs per row, etc., based on a number of desired exposures per pulse, or other criteria of a user. The SLMs 104 can be coupled to a support device 502. Support device 502 can have thermal control areas 504 (e.g., water or air channels, etc.), areas for control logic and related circuitry (e.g., see FIG. 4 showing elements 116 and element 402, which can be ASICs, A/D converters, D/A converters, fiber optics for streaming data, etc.), and windows 506 (formed within the dashed shapes) that receive SLMs 104, as is known in the relevant art. Support device 502, SLMs 104, and all peripheral cooling or control devices are referred to as an assembly. Assembly 500 can allow for a desired step size to produce the desired stitching (e.g., connecting of adjacent elements of features on object 112) and overlap for leading and trailing SLMs 104. By way of example, support device 502 can have dimensions of 250 mm×250 mm (12 in×12 in) or 300 mm×300 mm (10 in×10 in). Support device 502 can be used for thermal management based on being manufactured from a temperature stable material.

Support device 502 can be utilized as a mechanical backbone to ensure spacing control of SLMs 104 and for embedding the circuitry and the thermal controls areas 504. Any electronics can be mounted on either or both of a backside and front side of support device 502. For example, when using analog based SLMs or electronics, wires can be coupled from control or coupling systems 504 to active areas 300. Based on being mounted on support device 502, these wires can be relatively shorter, which reduces attenuation of analog signals compared to a case where the circuitry is remote from the support device 502. Also, having short links between the circuitry and active areas 300 can increase communication speed, and thus increase pattern readjustment speed in real time.

In some embodiments, when SLM 104 or electrical devices in the circuitry wear out, assembly 500 can easily be replaced. Although it would appear replacing assembly 500 is more costly than just a chip on assembly 500, it is in fact easier and quicker to replace the entire assembly 500, which can save production costs. Also, assembly 500 can be refurbished, allowing for a reduction in replacement parts if end users are willing to use refurbished assemblies 500. Once assembly 500 is replaced, only verification of the overall alignment is needed before resuming fabrication. In some examples, kinematic mounting techniques can be used to allow for repeatable mechanical alignments of assembly 500 during field replacements. This may eliminate a need for any optical adjustment of assembly 500.

Figure 6:
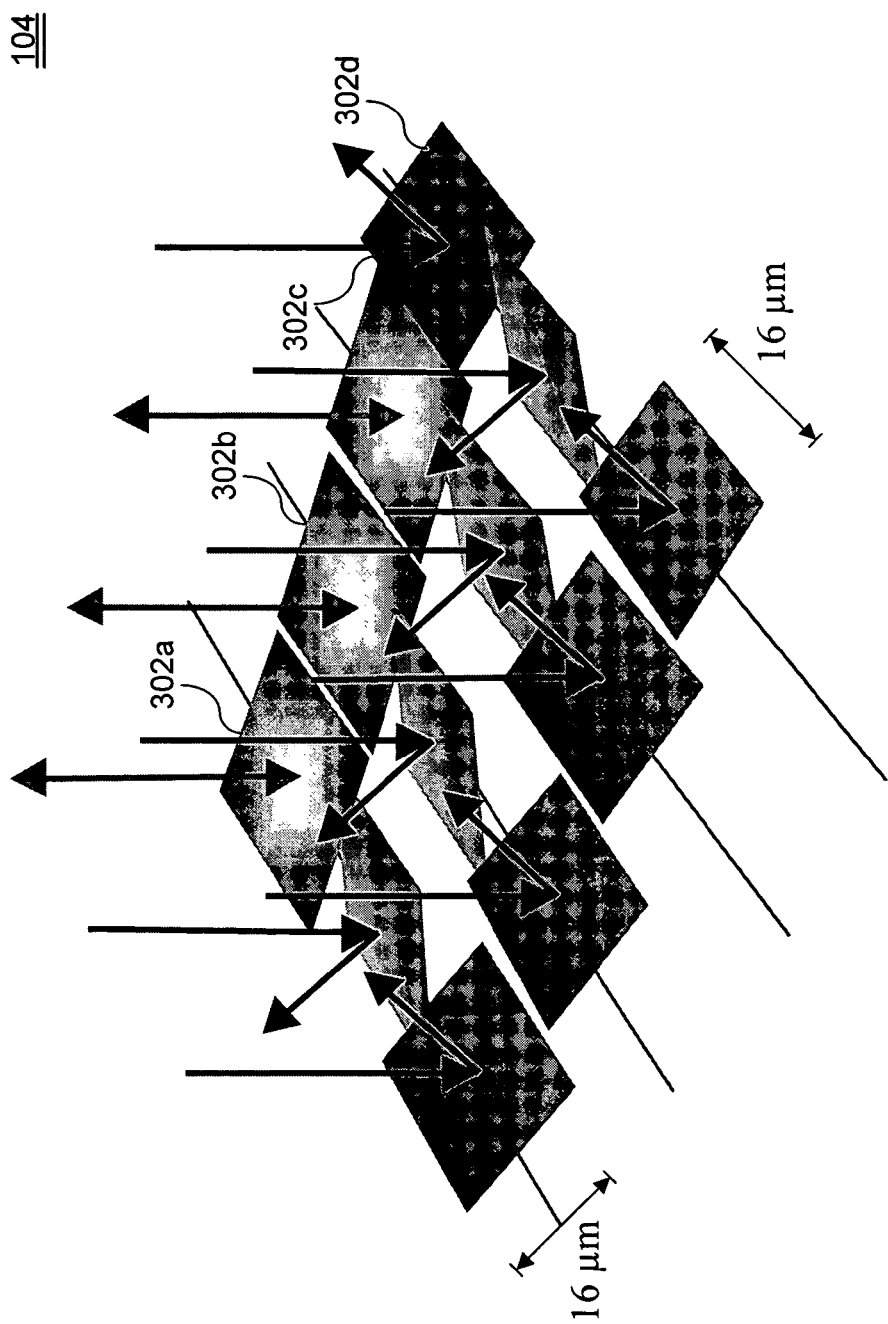
FIG. 6 illustrates a portion of a reflective SLM of one embodiment of the present invention.

Current SLM systems typically utilize 16 $\mu$m×16 $\mu$m pixels 302 (see FIG. 6), with next generation SLM systems moving to 8×8 $\mu$m pixels 302. A typical SLM 104 contains millions of pixels 302, wherein the properties of each pixel 302 are individually controlled by a voltage applied individually to each pixel 302. Note that SLM 104 can be both reflective and transmissive (for example, mirror type reflective SLMs, and LCD type transmissive SLMs). Reflective SLMs 104 are more commonly used in the industry today. FIG. 6 is an illustration of such a reflective, or tilting, type SLM 104, showing twelve pixels (of which 302a–302d are labeled). (Note that the invention is not limited to the pistoning type SLMs, but is also applicable to tilting SLMs as well as SLMs with otherwise deformable mirrors.) A capacitive coupling (not shown) is controlled using a transistor (not shown). A typical pixel 302 is controlled in a fashion similar to how parallel plates in a capacitor are controlled, in other words, a capacitive coupling is used to control the tilt of the mirrors of the pixels 302 using electrostatic forces. In FIG. 6, one of the mirrors (mirror of pixel 302d), is shown as tilted when the capacitor under that mirror is charged.

A particular problem that exists with the use of SLMs 104 is one of calibration of the individual elements or pixels 302. In the case of a piston type, or tilting mirror type, SLMs, the exact dependence of each mirror of each pixel 302 on the applied voltage may vary. Additionally, the mirrors are not entirely "solid" objects, and deform somewhat (in addition to tilt) when a voltage is applied. Furthermore, there are gaps between adjacent pixels 302, which degrade the optical performance due to additional reflections from "in between" the pixels 302.

Although the principal effect of changing the voltage applied to the pixel 302 is in the tilting affect, the deformation of the mirror of the pixel 302 is a secondary effect, but may be a substantial enough effect so as to affect the quality of the image. Thus, the problem stated in its most general form is one of determining the dependence of the orientation and shape of the mirror on the applied voltage, for each mirror in the SLM 104.

Each mirror changes the shape of its reflecting surface depending on the voltage ($V_j$) applied to its pixel 302:

$$S_j(x, y, V_j) = \underbrace{S^{(0)}(x - x_j, y - y_j, V_j)}_{\text{principal dependence, same for all mirror pixels}} + \underbrace{S_j^{(ind)}(x - x_j, y - y_j, V_j)}_{\text{individual variations of the pixels' properties}}$$

$$= \underbrace{T_j(V_j) \cdot (x - x_j)}_{\text{tilt, the principal effect}} + \underbrace{R_j(x - x_j, y - y_j, V_j)}_{\text{resisual shape variation}}$$

$$T_j(V_j) = T^{(0)}(V_j) + T_j^{(ind)}(V_j),$$

Diffraction field from a single mirror in the PO 110 entrance pupil is given by:

$$U_j(f_x, f_y, V_j) = FT(\exp(i \cdot 2\pi \cdot S_j(x, y, V_j) \cdot \lambda))$$

$$= \underbrace{U^{(0)}(f_x + T_j(V_j)/\lambda, f_y)}_{\substack{\text{principal mechanical effect,}\\ \text{the tilt, results in a shift of the}\\ \text{field pattern in the pupil}}} + \underbrace{U_j^{(ind)}(f_x, f_y, V_j)}_{\substack{\text{resisual shape variations}\\ \text{result in a deformation of}\\ \text{the diffraction pattern}}}$$

where $(f_x^2+f_y^2)^{1/2} < (1+\sigma) \cdot NA/\lambda$, and $\sigma$ corresponds to typical PO 110 illumination. Note that for purposes of calibration, the PO 110 used normally in the tool may be replaced (or augmented with) auxiliary calibration optics. The auxiliary calibration optics in the ML Tool are typically needed to resolve pixels 302, since the regular projection optics of the tool usually cannot resolve pixels 302, and because a shearing interferometer might need more space than is available otherwise.

Only the variation of the diffraction field within the PO 110 entrance pupil is of significant importance. Thus, high-frequency variations of the reflective surface shape of the mirror are less important than the principal effect (the mirror tilt). In practical terms, the mirrors are operated not as "analog" devices, but more akin to digital devices, with, for example, each mirror oriented in one of 64 possible orientations. For a 1,000×1,000 mirror SLM 104, this results in needing to know the dependence of the SLM 104 on 64,000,000 voltages. An alternative way to formulate this problem is to require that the angular orientation of each mirror for some specific voltage is the same for all mirrors in the SLM 104. However, this may require applying different voltages to different pixels 302, because different pixels 302 may have a different response to the same voltage, due to a variation in the mechanical properties from one mirror to another.

Thus, knowledge of the shape assumed by each mirror in the SLM 104 in response to the voltages applied can be used for calibration of each mirror to result in the same tilt response for each pixel 302 in the SLM 104.

Also, the process of calibration can identify any pixels 302 that are broken and/or not functioning properly. Furthermore, even when no voltage is applied to any of the pixels 302, the surface of the SLM 104 is not a perfectly flat mirror, but rather has height variations across the surface, which also potentially degrade image quality. This is primarily due to the imperfections in the pixels and deficiencies in the manufacturing process. This is another issue that should be addressed by the calibration process.

For all current practical purposes, it is therefore sufficient to solve the following problem:

For each pixel 302, that is pixel$_j$, where j=1, ..., N, determine the set of voltage levels, $V_j^{(n)}$, where n=1, ..., N, such that any two different pixels j1 and j2 with the voltages of the same levels $V_{j1}^{(n)}$ and $V_{j2}^{(n)}$ applied to them will produce (almost) the same image fields.

A more general problem, the solution of which would fully describe the imaging properties of the SLM 104, is as follows: for each pixel 302, find the dependence of its image field on voltage (within a certain range of voltage variation), applied to this pixel.

The shape of each mirror is measured by analyzing the image created by that mirror in the image plane. Another way to view the calibration problem is as follows: if there are (e.g.) 64 voltages, such that each voltage corresponds to a certain mirror position, we need to determine the 64 voltages for each mirror such that all the mirrors have the identical position (or orientation) for each voltage. In order to accomplish this goal, that is, in order to orient the mirrors in the same direction (at some voltage), it is necessary to know the characteristics of the mirrors, such as mirror response to the voltages and the deformation of each individual mirror at the particular voltages.

It is possible, in theory, to turn off all the pixels 302 except for the one pixel 302 being calibrated, and by measuring the image of that one pixel 302 in the image plane at various voltages, calibrate that pixel 302 very precisely. However, given the fact that the pixels 302 number in the millions, doing this process pixel-by-pixel can be time consuming or even impractical. A somewhat intermediate approach would be to calibrate several pixels 302 at a time, where the pixels 302 being calibrated are separated far enough from each other such that they do not interfere with each other in the image plane. However, this process can still be fairly time-consuming.

The second problem of calibration is particularly relevant to reflective tilting micromirror type SLMs, and has to do with how the pixels 302 are imaged. It is important that the pixels 302 be imaged in such a way that they are not resolved by the projection optics 110. In order to modulate the light, the pixel 302 should not be resolved. If all the light from the tilting pixel 302d is captured by the projection optics 110, the pixel 302d will not modulate. If the pixel 302 is a square, its diffraction pattern is a sinc function, with a large zeroth order lobe, and smaller side lobes. When a pixel 302 is tilted, the diffraction pattern from the pixel 302 shifts an angular space to the side. With a large enough entrance pupil of the projection optics 110, many side lobes from the diffraction pattern will be captured (if the pixel 302d is tilted at a relatively small angle only). Thus, in this case, the amount of light captured by the projection optics 110 does not vary, and the pixel 302 will not modulate. For practical purposes, the pixel 302 has to be imaged in such a way that it is not resolved.

On the other hand if the projection optics 110 only captures a portion of the zeroth order lobe, for example, ½ or ⅓ of the total amount of energy in the zeroth order lobe, then tilting the pixel 302d modulates the amount of light passing through the projection optics 110. Thus, it is essential for the modulation mechanism that the pixel 302d not be resolved, in order to have a modulation effect. However, because the pixel 302d is not resolved, instead of seeing a "sharp square" (for a square pixel or mirror), a "blob" of light will be imaged, and will exceed the nominal dimensions of the "sharp square" by several times. Thus, images from neighboring pixels 302 will overlap. The neighboring pixels 302 therefore will strongly interact with each other. This creates a problem with modulation, because at each point in the image plane, light is received from several pixels 302.

These two considerations make the problem of calibration difficult—resolving the pixel 302 into a "sharp square" means that there is no effective modulation, and effective modulation means that the pixel 302 cannot be resolved.

Phrased another way, either one has a resolution that one desires, or sensitivity to a shape of the pixel, but not both.

Figure 7:
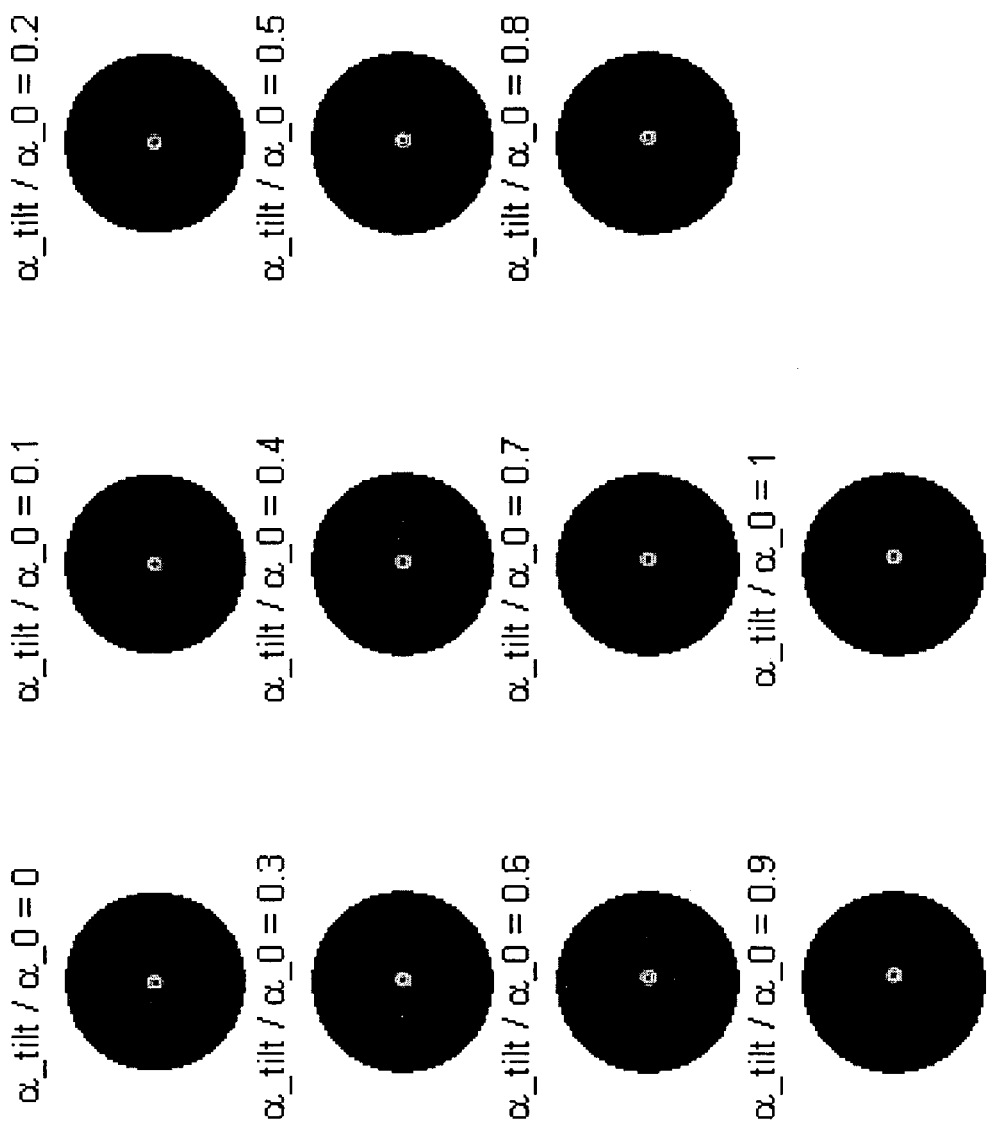
FIG. 7 illustrates a field in a pupil of the projection optics for ten different tilt values, for a large numerical aperture projection optics.
Figure 8:
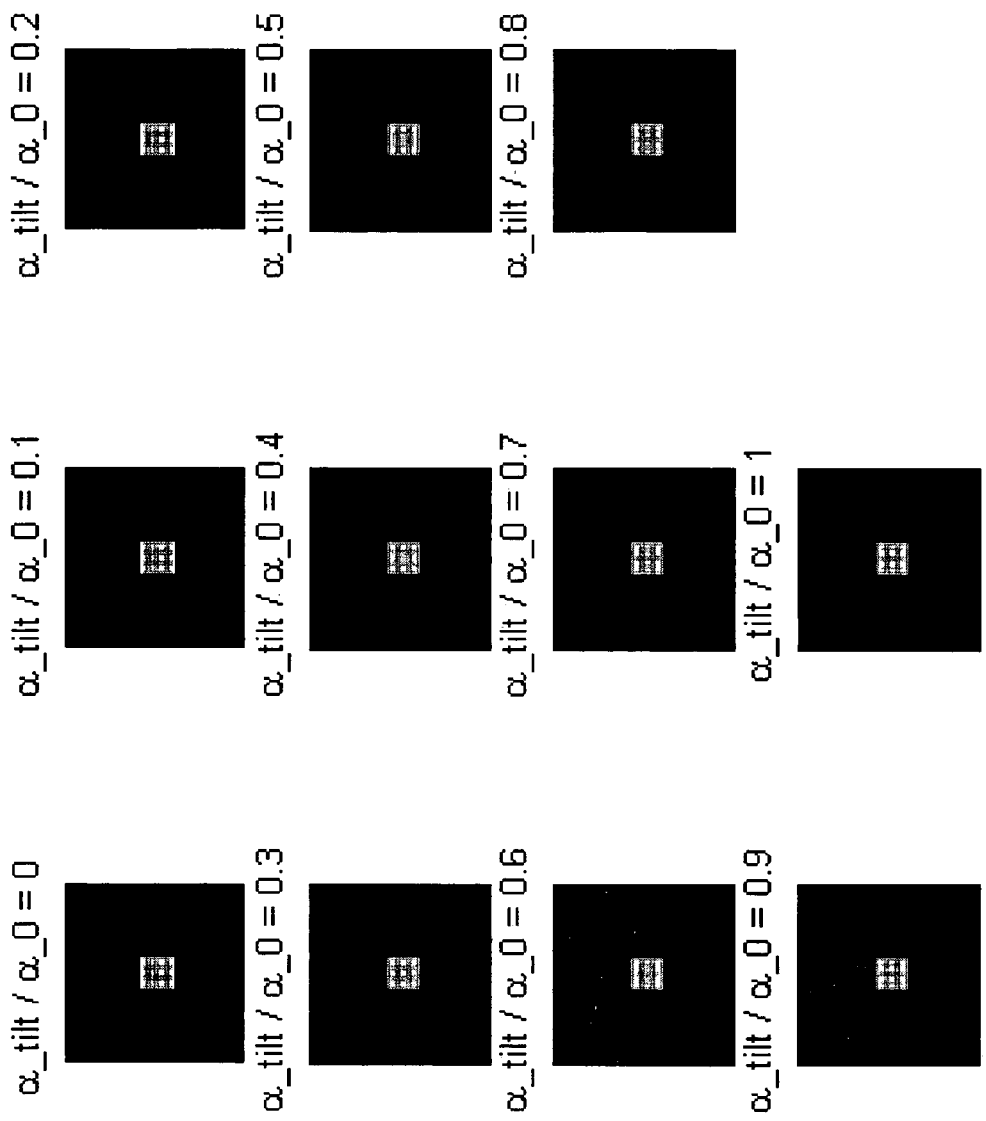
FIG. 8 illustrates a field in the projection optics image plane that corresponds to FIG. 7.

For the example illustrated in FIGS. 6–8, $\lambda$=193.375 nm, L (pixel dimension)=16 $\mu$m, NA (calibration PO)=10*$\lambda$/L=0.12 (i.e., the calibration PO 110 captures up to the 10th diffraction order, which means it resolves the pixel 302 well), pixel 302 tilts between $\alpha$=0 and $\alpha$=$\alpha_0$=$\lambda$/(2 L)—the range of tilts to calibrate. FIG. 7 illustrates the field in the pupil of the projection optics 110 for ten different tilt values for a single pixel (note that with this and subsequent related figures, modulation of only one pixel is illustrated for clarity, although the invention permits measurement of multiple pixels simultaneously). With a numerical aperture of 0.12 (a fairly large numerical aperture), the pixel 302 is well defined in the PO pupil field for all the tilt angles illustrated. However, as shown in FIG. 8, in the PO image plane, there is virtually no modulation of intensity for the entire angular range. In other words, with so many diffraction orders captured by the large numerical aperture projection optics 110, modulation is not achieved, even though the pixel 302 is well resolved in the PO image plane.

Figure 9:
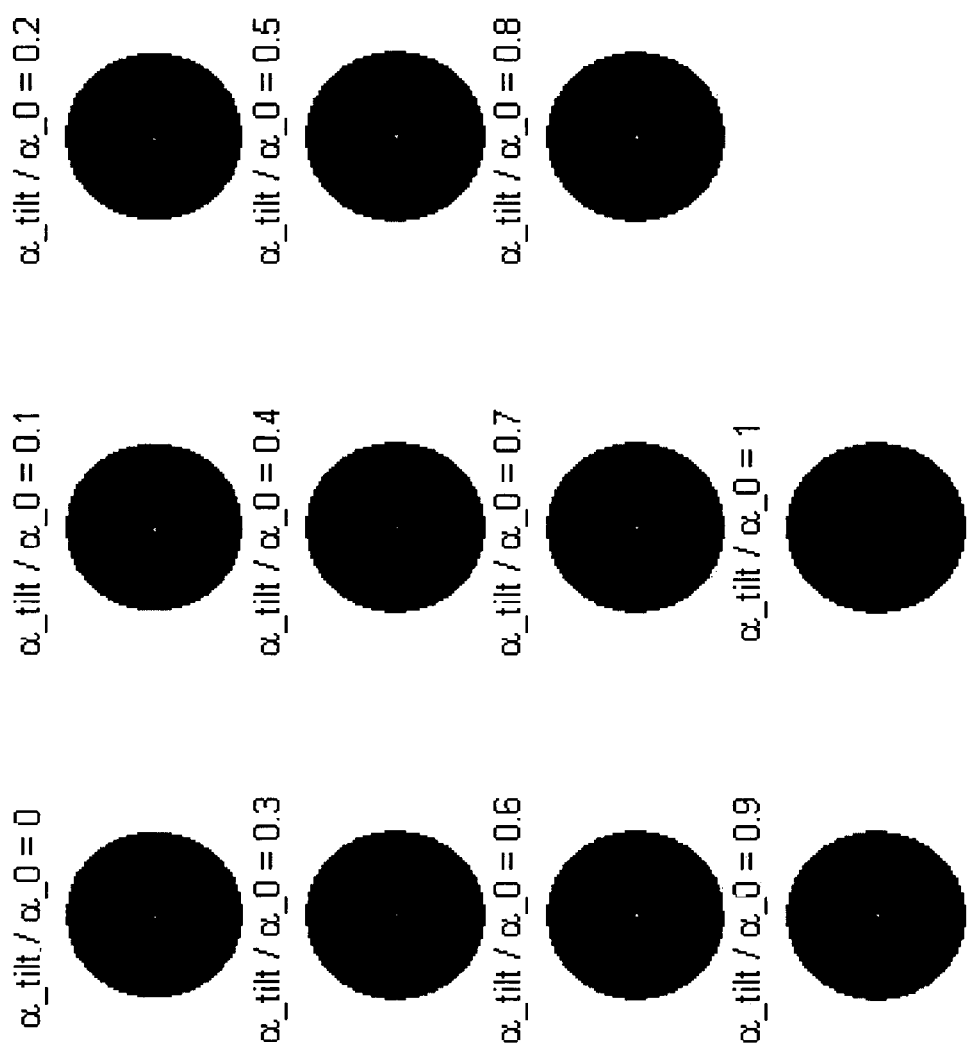
FIG. 9 illustrates a field in a pupil of the projection optics for ten different tilt values for a small numerical aperture projection optics.
Figure 10:
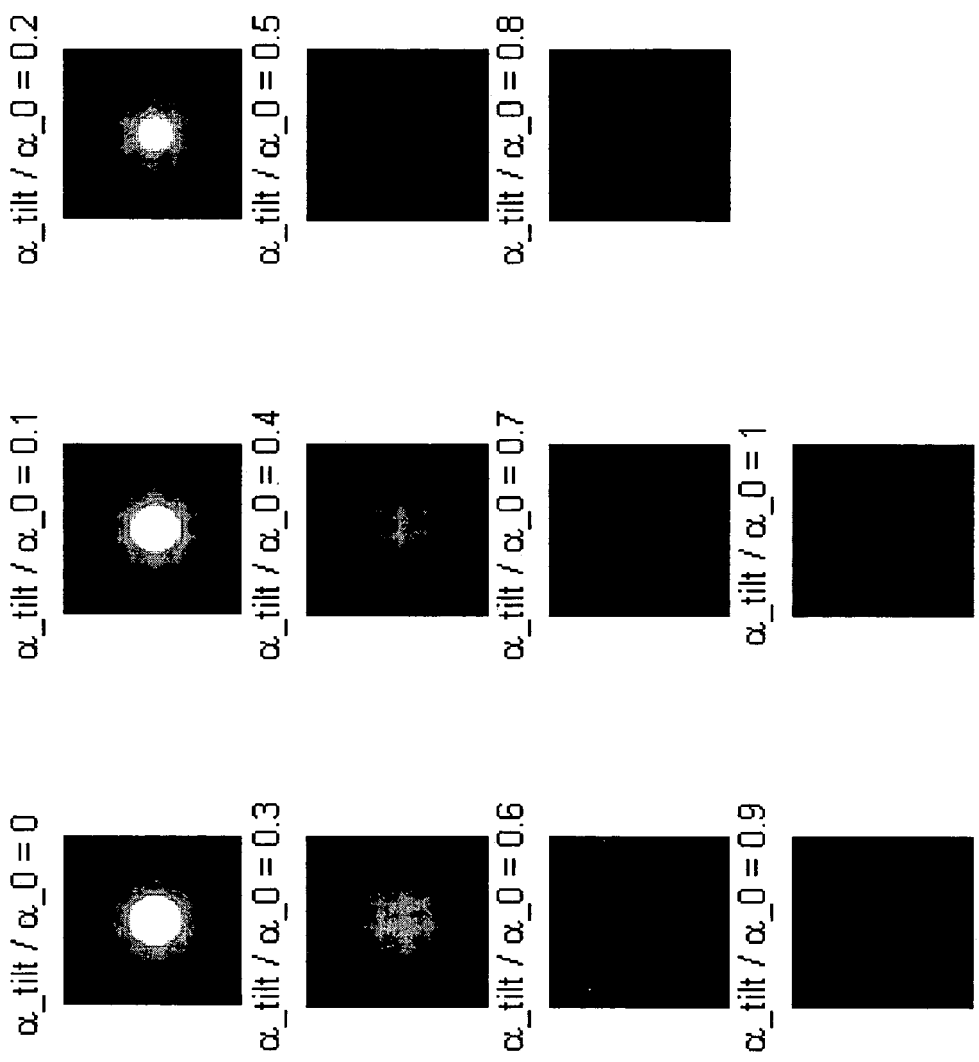
FIG. 10 illustrates a field in the projection optics image plane that corresponds to FIG. 9.

FIG. 9 illustrates the "opposite case" of using a very small numerical aperture, in this case a numerical aperture of 0.00265. Here, the field is resolved in the pupil plane (see FIG. 9) but is very poorly resolved in the image plane (see FIG. 10) for ten different tilt angles. Specifically, as shown in FIG. 10, although there is good modulation for the different tilt angles, the image of the pixel 302 is very "spread out," which means that adjacent pixels 302 would interfere with each other if imaged simultaneously, and that measuring the distortion and shape of the reflections across each pixel 302 would be difficult.

The solution to this problem is the utilization of planar interferometry. If the SLM 104 is visualized as a perfect mirror, and a planar wave is directed at the SLM 104, the reflected wave should also be planar. If one or more of the mirrors is tilted, or pistoned, the reflected wave will be formed accordingly. In other words, a mirror adjustment corresponds to having an aberration in the reflected planar wavefront. Thus, conceptually, modulation of the SLM 104 can be viewed as the introduction of an aberration into the wavefront. Measuring the modulation effect of the SLM 104 can be viewed as the measurement of wavefront aberration using interferometry. In this case, unlike traditional wavefront aberration measurements, the spatial frequency is comparable to the dimension of the mirror, i.e., the dimension of the pixels 302.

A simple type of an interferometer that can be used to measure wavefront aberrations is a Michelson interferometer, where a wavefront is separated (for example, using a beam splitter), then one half of the wavefront passes through a medium that introduces aberrations, and is then combined with the unaberrated half of the wavefront. Thus, phase distortion becomes apparent in terms of intensity variation in the image plane. A Michelson interferometer, which uses interference between a reference wavefront and a reflected wavefront (from the SLM 104) can, in principle, be used to calibrate the SLM 104. Using the Michelson interferometer approach, it is possible to determine the deviation from perfect flatness (planarity) of the SLM 104 by combining a reference wavefront with a wavefront reflected off the SLM 104 when no voltage is applied. After determining the deviation from perfect planarity of the SLM 104, the rest of the measurements can be performed by combining wavefronts obtained with tilted mirrors with a reference wavefront.

The use of a Michelson interferometer is not without its difficulties. It requires additional optical elements, such as beam splitters, etc. It also requires addressing the issue of temporal coherence in the incoming wavefront. The advantage of shearing interferometry is that instead of interfering a referenced wavefront with the reflected wavefront, which requires the addition of optical elements, in the shearing interferometry approach, the wavefront interferes with a sheared copy of itself.

A shearing interferometer can use a grating to shift the wavefront laterally. Other arrangements are possible, for example, rotation of the wavefront, radial displacement of the wavefront, stretching of the wavefront, "flipping" of the wavefront, etc. By interfering the sheared wavefront with the original wavefront, it is possible to produce interference fringes in the image plane, which enable one to determine aberrations in the wavefront, and in turn enable one to determine the dependence of the mirror tilt on the applied voltage. The simplest arrangement is the use of a shearing grating placed in the pupil of the projection optics 110. This produces two wavefronts, which are laterally shifted with respect to each other. Thus, even if the pixels 302 are resolved in the image plane, it is possible to measure the dependence of the tilt of each mirror on the applied voltage.

Figure 11:
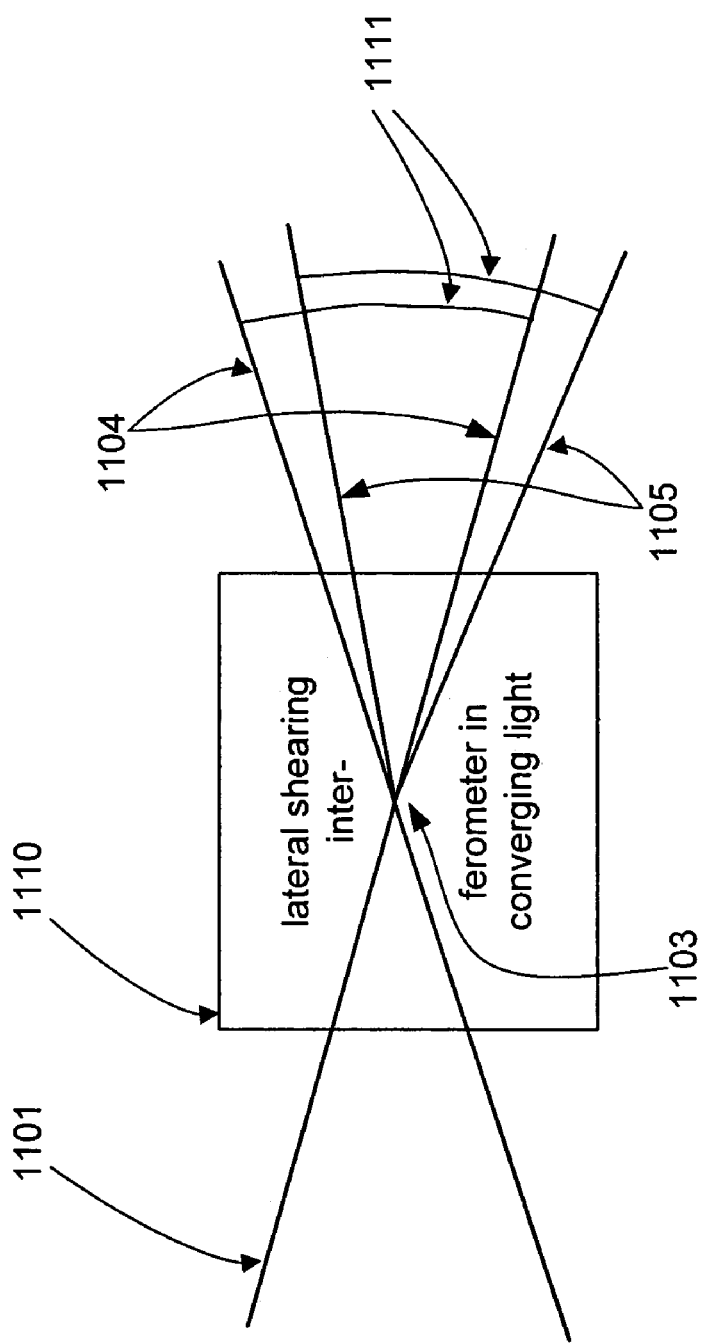
FIGS. 11–12 illustrate an example of a shearing interferometer arrangement that may be used in the present invention.
Figure 12:
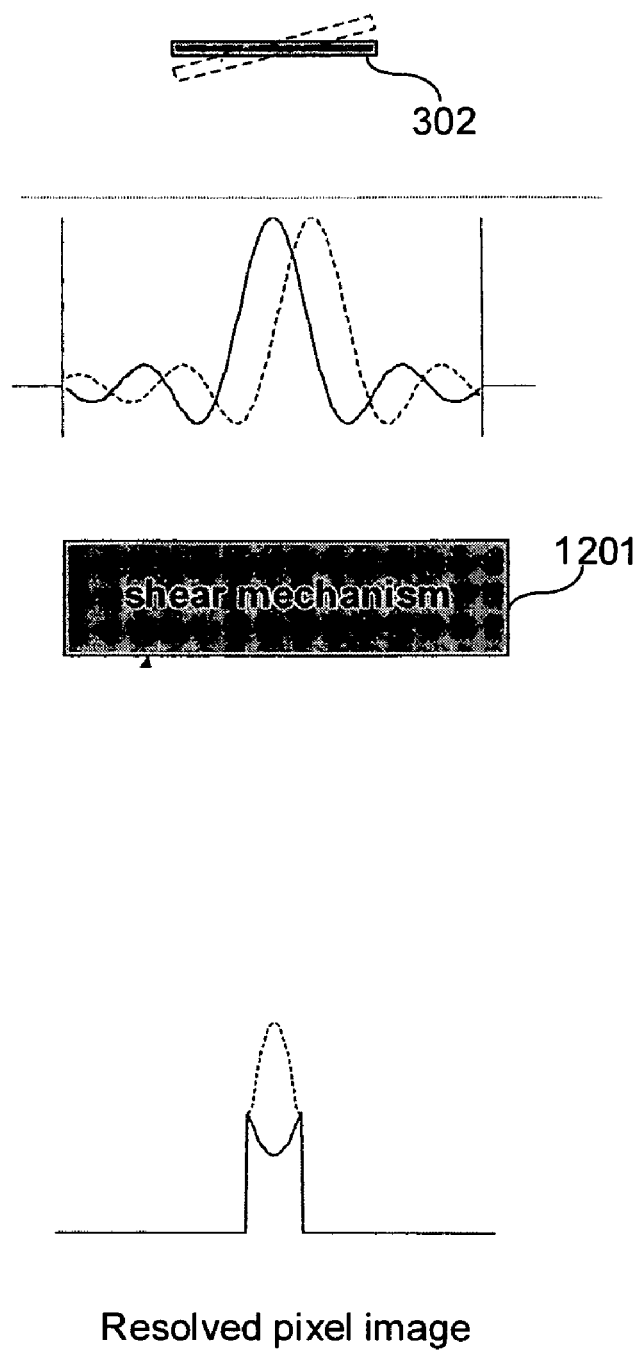

FIGS. 11 and 12 illustrate the use of a pupil in a lateral shearing interferometer 1110 to produce reference wavefronts and shear wavefronts. As shown in FIGS. 11 and 12, a wavefront 1101 converges at a point in space, while emanating from a primary source. An image of a point source exists at an entrance pupil. A partially transmitting film may be placed at the entrance pupil. A pinhole 1103 is positioned at the entrance pupil. The pinhole 1103 generates a transmitted wave 1104 with a wavefront 1111, which includes a diffracted spherical reference wave 1105. Thus, the lateral shearing interferometer 1110 creates one or more apparent sources, whose wavefronts 1111 interfere to produce fringes.

An image shearing mechanism 1201 (see, for example, the grating illustrated in FIG. 13) is positioned within the shearing interferometer 1110, and generates the multiple wavefronts 1104, 1105 that are then detected by a CCD detector in the image plane (not shown). The image shearing mechanism 1201 may be a diffraction grating, a prism, a folding mirror, or any other device used for generating shear. Note that for SLM calibration, it is necessary to measure the aberrations occurring in the object plane of the PO 110. Therefore, the shearing grating should be placed in the pupil of the PO 110 and the interferograms will be observed in the image plane.

As explained above, the modulated SLM 104 results in an introduction of a certain wavefront aberration that depends on the modulated states of its pixels 302. In order to calibrate the SLM 104, the actual modulated states of each pixel 302 resulting from a certain driving voltages applied to them, need to be determined. The shearing interferograms measured in the image plane can be interpreted, using any number of known methods, to derive the wavefront aberration from the measured shearing interferograms. The result of this interpretation will yield the actual modulated state of each pixel 302.

Phase stepping technique used in lateral shearing interferometry can be used to improve the accuracy and to separate the interference from higher diffraction orders (if a shearing grating in the pupil is used to provide a shear). Phase stepping can be implemented by either shifting the pupil apodization grating in small steps within one grating period, or by shifting the object (SLM array 104), or by tilting the illumination.

A partially coherent illumination of the calibrated SLM 104 may be needed to reduce the effect of the flare in the PO 110 or a speckle, observed with coherent illumination. If a shearing grating in the pupil of the PO 110 is used to provide shear, a partially coherent illumination source will reduce the contrast of the interferogram. This can be countered by providing partially coherent illumination from an extended source that is modulated by a grating with a period that matches the period of the shearing grating in the pupil (similar to the use of matching pair of Ronchi gratings in lateral shearing interferometry).

One embodiment of the present invention can use an arrangement where all pixels 302 of the SLM 104 are calibrated simultaneously, or where only even columns of pixels 302 are tilted, while odd columns are not (or, equivalently, odd and even rows). In the image plane, modulated pixels 302 will overlap with the unmodulated ones. The images in the image plane therefore are the result of an interference between a modulated pixel 302 and a neighboring unmodulated one. This is somewhat analogous to the Michelson interferometer arrangement, where an aberrated wavefront interferes with a planar wavefront (in this case, coming from the untilted mirror). This permits a determination of the shape of the modulated pixel 302*d* for each voltage, which corresponds to a particular tilt angle and mirror shape. In other words, the shear is effected by an integer number of pixels 302.

Figure 13:
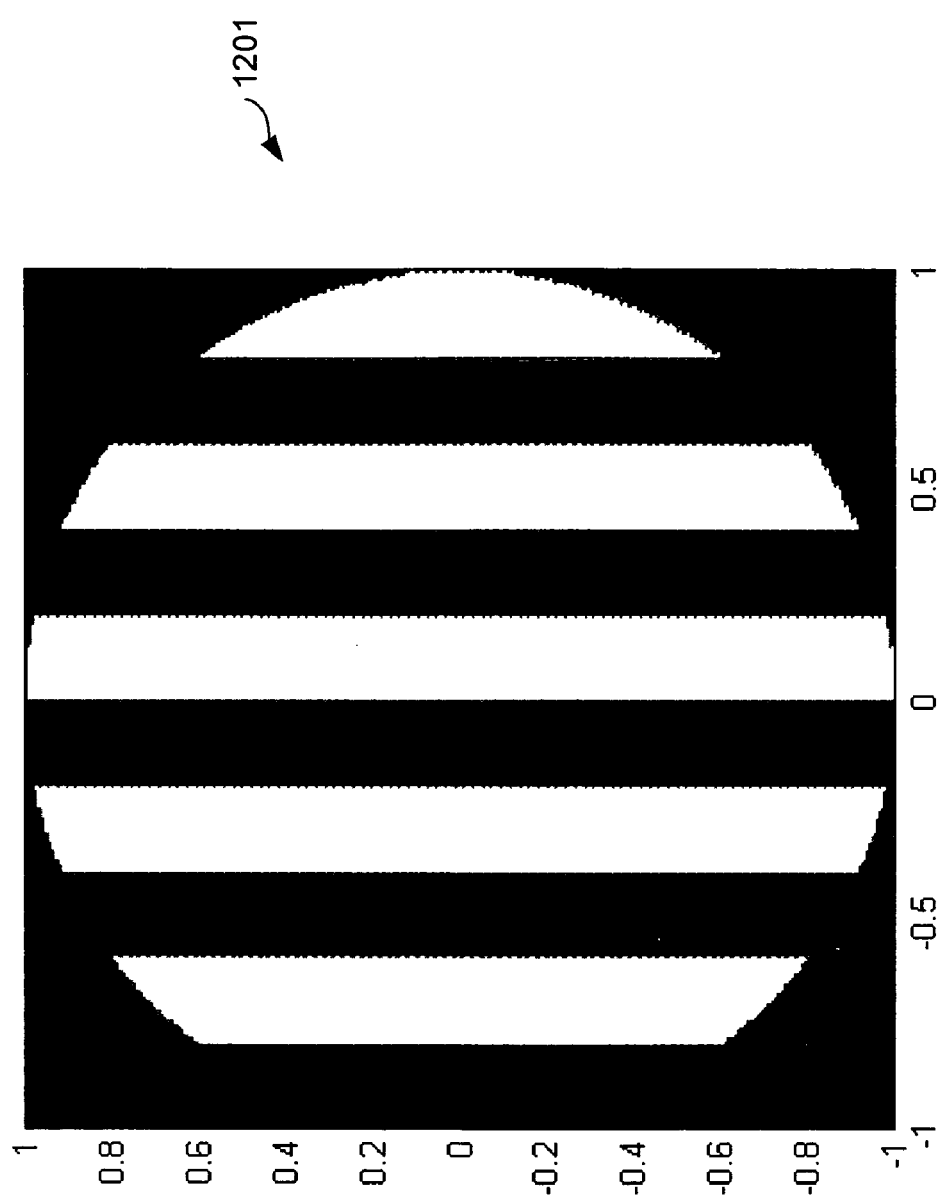
FIG. 13 illustrates a grating that may be used in the shearing interferometer of FIGS. 11–12.

Another embodiment utilizes shearing by a fraction of a pixel 302 (e.g., ¼, or ⅓), such that each pixel 302 interferes primarily with itself (the amount of the shear depends on the pitch of the grating 1201 of FIG. 13).

The advantage of the approach described above is in enabling simultaneous measurement of a very large number of pixels 302 (potentially all of the pixels 302 of the SLM 104). Also, the above approach solves the problem of being unable to resolve the pixels 302 sufficiently in the image plane. The variation of intensity within each "square" corresponds to the shape of each pixel 302.

Because the pixels 302 are resolved, there is no need to iterate or use a large number of non-interfering groups of pixels 302. Also, each pixel 302 is calibrated individually, without basing a calibration procedure on a specific pattern. The SLM however needs to be imaged in a way that is different from the way it is imaged in the tool. This can be achieved by introducing a special calibration PO section between the SLM and the tool PO 110 (during the calibration procedure only).

Because the pixels 302 are resolved during the calibration, their images depend on the shape and magnitude of the higher diffraction orders. A special consideration needs to be given to account for the dependence of the measured resolved image on the higher diffraction orders (which are not captured by the tool PO).

Figure 14:
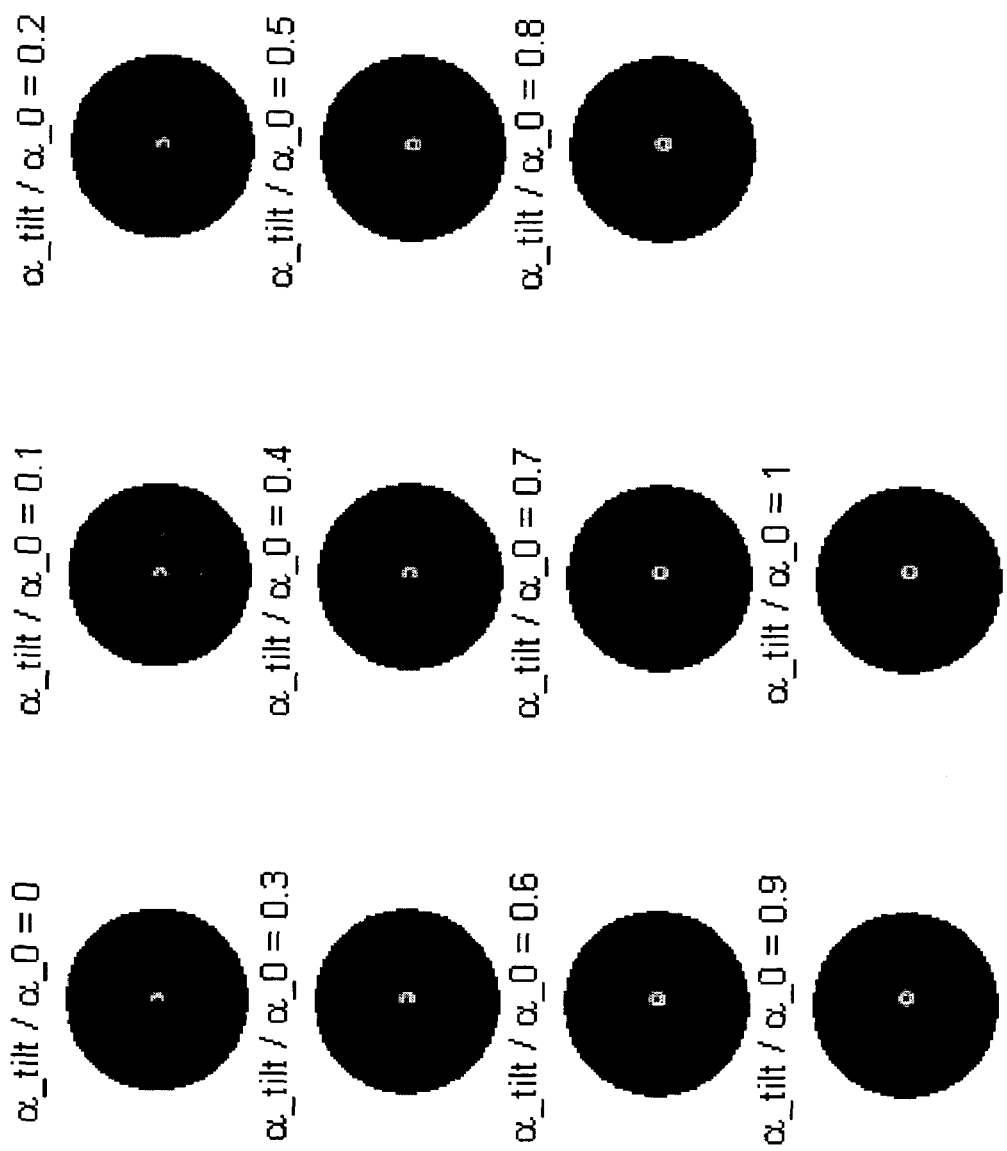
FIG. 14 illustrates a field in a pupil of the projection optics for ten different tilt values in the system of the present invention.
Figure 15:
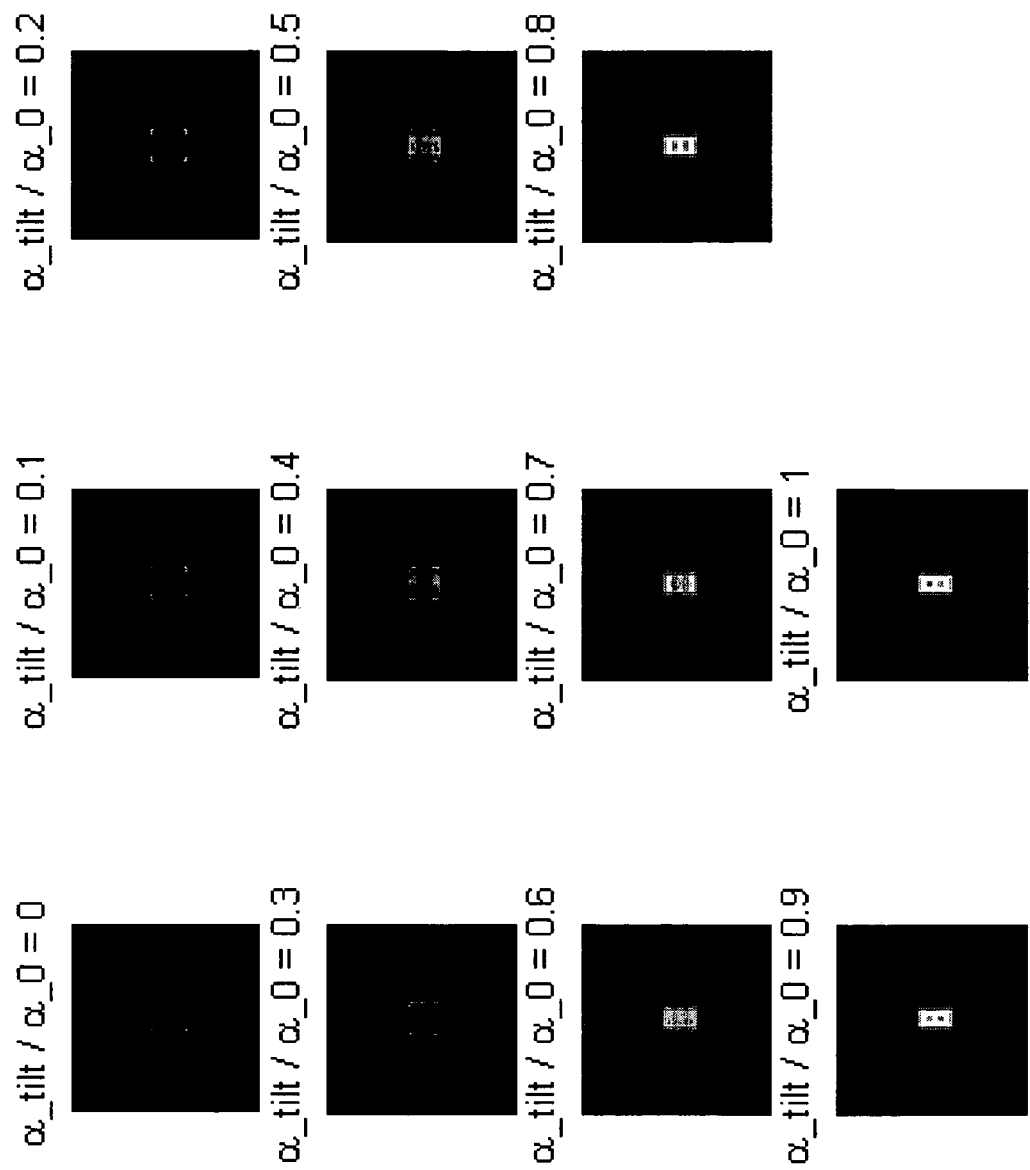
FIG. 15 illustrates a field in the projection optics image plane that corresponds to FIG. 14.

The effect of adding the shearing interferometer 1110 with the grating 1201 that shears the beam laterally by ¼ of the pixel 302 width, is illustrated in FIGS. 14 and 15. FIG. 14 illustrates the field in the pupil plane for ten different tilt values. Note that some of the images are "partial," due to the one-quarter pitch diffraction grading, as noted above. In the image plane, as illustrated in FIG. 15, the pixel 302 is well resolved (a square or rectangular shape is clearly visible), and at the same time there is good modulation for the different tilt angles, notwithstanding the relatively small numerical aperture. In other words, the use of a shearing interferometer permits the achievement of both goals: good resolution in the image plane, combined with good modulation in the angular space.

Figure 16:
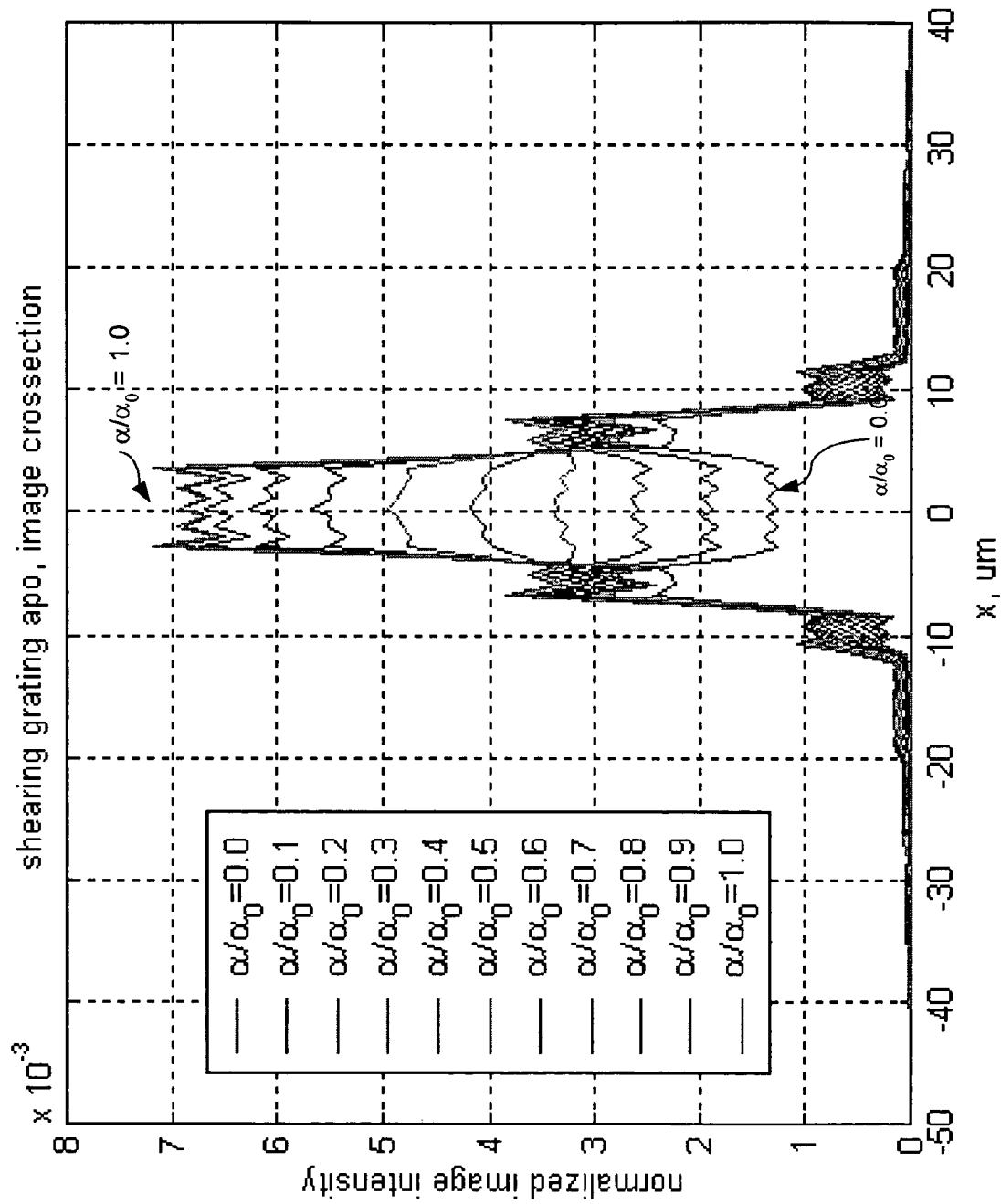
FIG. 16 is an illustration of the image cross-section of one pixel in the image plane that corresponds to FIG. 15.
Figure 17:
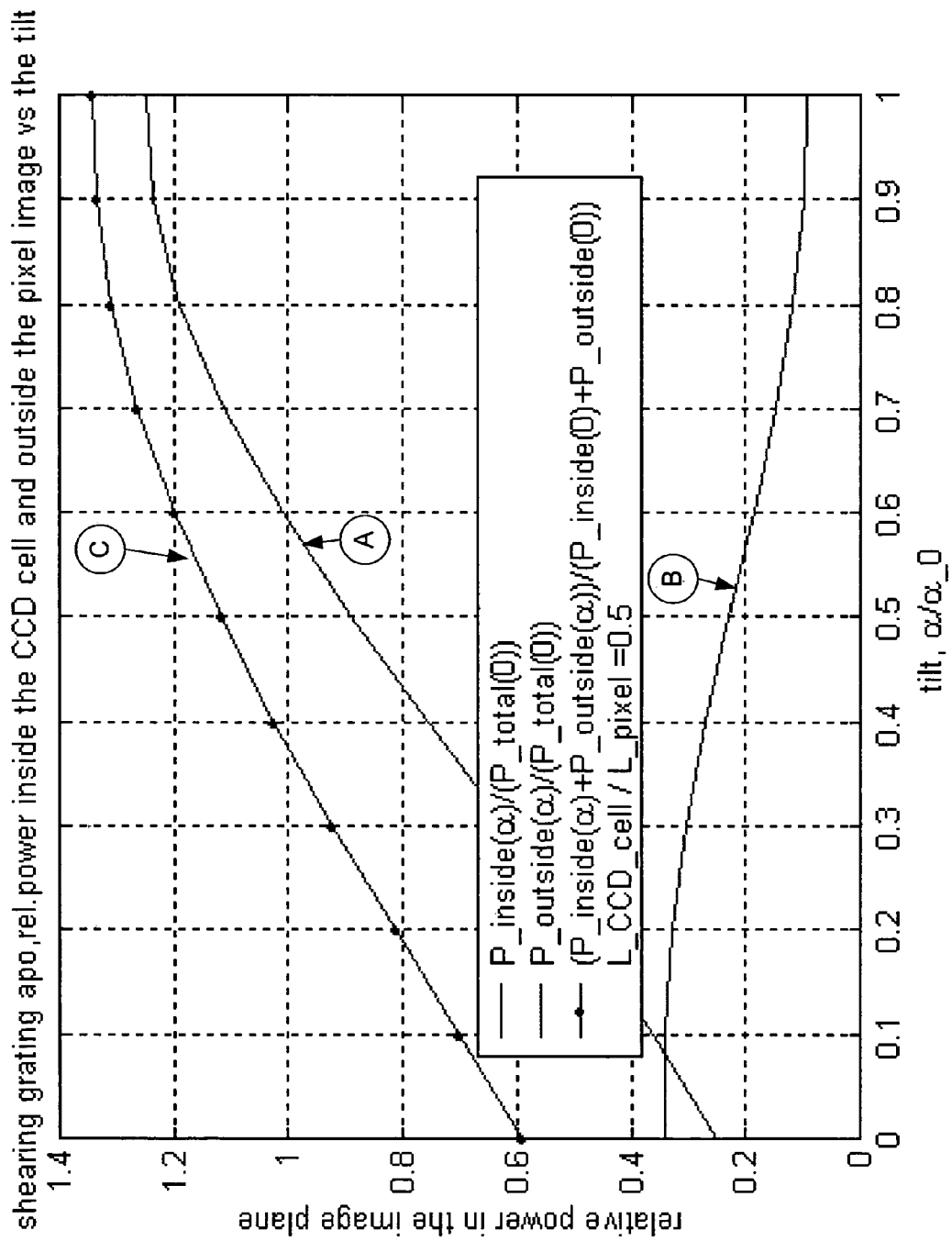
FIG. 17 illustrates a relative power in the image plane for the various tilt angles that corresponds to FIG. 15.

FIG. 16 is an illustration of the intensity cross-section of one pixel 302 in the image plane for the different tilt angles of the mirror. The graphs are inverted relative to the legend on the left-hand side of the figure; in other words, the 0.0 tilt is at the bottom, and the 1.0 relative tilt is at the top. FIG. 17 illustrates the relative power in the image plane for the various tilt angles. Graph A illustrates the total power received within a specified area defined by pixel 302 dimensions in the image plane, and graph B specifies the power outside that area. Graph C is the sum of graphs A and B. In the ideal case, graph B would be nearly perfectly flat and relatively low in magnitude, which is achieved here.

Although the discussion above is primarily in terms of calibrating a tilting micromirrors-based SLM, the invention is also applicable to other types of SLMs, such as SLMs utilizing pistoning or otherwise deformable micromirrors, or SLMs utilizing transmissive (refractive) pixels based on other modulation principles.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for calibrating a spatial light modulator array comprising:
   a spatial light modulator array;
   a projection optical system that images the spatial light modulator array onto an image plane;
   a shearing interferometer that generates an interference pattern in the image plane; and
   a controller that modulates the spatial light modulator array.

2. The system of claim 1, wherein the shearing interferometer comprises any of a diffraction grating, a prism, and a folding mirror for generating shear.

3. The system of claim 1, wherein the shearing interferometer is a lateral shearing interferometer.

4. The system of claim 1, wherein the shearing interferometer is a stretching shearing interferometer.

5. The system of claim 1, wherein the shearing interferometer is a rotational shearing interferometer.

6. The system of claim 1, wherein the projection optics resolves each element of the spatial light modulator array in the image plane.

7. The system of claim 1, wherein the controller modulates alternate columns of elements of the spatial light modulator array.

8. The system of claim 1, wherein the shearing interferometer comprises a diffraction grating with a pitch corresponding to a shear of the light by an integer number of elements of the spatial light modulator array.

9. The system of claim 1, wherein the shearing interferometer comprises a diffraction grating with a pitch corresponding to a shear of the light by a fractional number of elements of the spatial light modulator array.

10. The system of claim 1, wherein the controller controls any of tilting, pistoning, and deformation of the elements.

11. The system of claim 1, further including a CCD detector in the image plane for detecting the interferogram.

12. The system of claim 11, wherein the CCD detector comprises a plurality of detector cells corresponding to each element of the spatial light modulator array.

13. The system of claim 1, wherein the spatial light modulator array is a reflective spatial light modulator array.

14. The system of claim 1, wherein the spatial light modulator array is a pistoning spatial light modulator array.

15. The system of claim 1, wherein the spatial light modulator array is a tilting micromirror spatial light modulator array.

16. The system of claim 1, wherein the spatial light modulator array is a transmissive spatial light modulator array.

17. A method for calibrating a spatial light modulator array comprising:
(a) modulating a spatial light modulator array;
(b) imaging the spatial light modulator onto an image plane;
(c) shearing the light so as to create an interference pattern in the image plane;
(d) measuring interference fringes; and
(e) repeating the steps (a)–(d) to calibrate the spatial light modulator array.

18. The method of claim 17, wherein step (c) comprises shearing the light using any of a diffraction grating, a prism and a folding mirror.

19. The method of claim 17, wherein step (c) comprises shearing the light using a stretching shearing interferometer.

20. The method of claim 17, wherein step (c) comprises shearing the light using a rotational shearing interferometer.

21. The system of claim 17, wherein step (c) comprises shearing the light using a diffraction grating with a pitch corresponding to a shear of the light by an integer number of spatial light modulator array elements.

22. The system of claim 17, wherein step (c) comprises shearing the light using a diffraction grating with a pitch corresponding to a shear of the light by an fractional number of spatial light modulator array elements.

* * * * *

UNITED STATES PATENT AND TRADEMARK OFFICE
CERTIFICATE OF CORRECTION

PATENT NO. : 6,965,436 B2
DATED : November 15, 2005
INVENTOR(S) : Azat M. Latypov It is certified that error appears in the above-identified patent and that said Letters Patent is hereby corrected as shown below:

Column 14,
Line 19, "by an fractional number" should be replaced with -- by a fractional number --.

Signed and Sealed this

Fourth Day of April, 2006

JON W. DUDAS
*Director of the United States Patent and Trademark Office*